United States Patent [19]

Hoover

[11] Patent Number: 4,610,299

[45] Date of Patent: Sep. 9, 1986

[54] SPRING-BIASED HEAT SINK

[75] Inventor: C. G. Hoover, Fort Worth, Tex.

[73] Assignee: S.I.E., Inc., Fort Worth, Tex.

[21] Appl. No.: 718,512

[22] Filed: Apr. 1, 1985

[51] Int. Cl.⁴ .......................................... H01L 23/34
[52] U.S. Cl. .................................... 165/80.2; 165/185
[58] Field of Search ..................... 165/185, 80.2, 80.3, 165/80.4

[56] References Cited

U.S. PATENT DOCUMENTS

| 3,225,318 | 12/1965 | Heithaus | 165/185 X |
| 3,366,171 | 1/1968 | Scharli | 165/185 X |
| 3,744,560 | 7/1973 | Sell, Jr. | 165/185 |
| 4,400,858 | 8/1983 | Goiffon et al. | 24/255 BS |
| 4,415,025 | 11/1983 | Horvath | 165/185 |
| 4,462,462 | 7/1984 | Meagher et al. | 165/80 C |

FOREIGN PATENT DOCUMENTS 928848  6/1963  United Kingdom ............... 165/80.3

Primary Examiner—Sheldon J. Richter
Attorney, Agent, or Firm—James E. Bradley

[57] ABSTRACT

A heat sink for a well logging instrument aids in dissipating heat from electronic components. The heat sink is of rigid, heat conductive metal. The heat sink has an outer surface that is arcuate for mating with the inner surface of the instrument housing. The electrical components are mounted directly to the heat sink. Springs located on each end of the heat sink urge the heat sink outer surface into contact with the housing.

9 Claims, 6 Drawing Figures

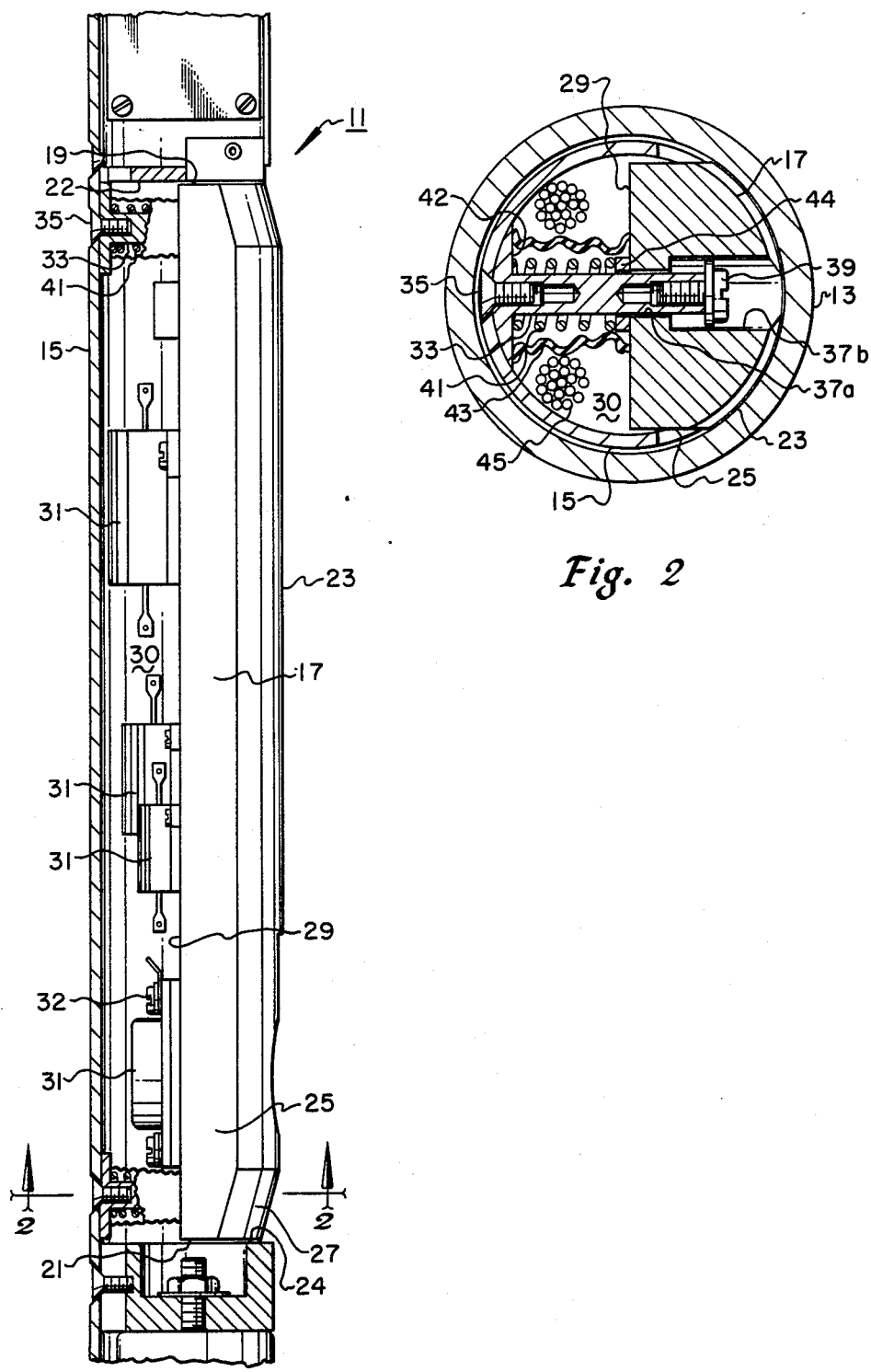

SPRING-BIASED HEAT SINK

BACKGROUND OF THE INVENTION

1. Field of the Invention

This invention relates in general to instruments for measuring formation characteristics in wells, and in particular to a means for transferring heat from electronic components within the instrument.

2. Description of the Prior Art

A wireline logging instrument is an instrument that is lowered into a borehole or well for measuring earth formation characteristics. The instrument has a sealed tubular housing within which electrical and electronic components are located. Present day logging instruments are complex, having thousands of components in the downhole tool, and often extending to lengths of 30 feet or greater. Some of these components include circuitry such as microprocessors, power supplies and telemetry components.

The environment of the well is hostile to such sensitive electronic components. In some cases, the temperature is 300° F. or greater which is deleterious to the electric components in the instrument. Also, some of the components give off considerable heat themselves. For example, power transistors are normally mounted simply on a circuit board along with other components. These elements produce heat into the atmosphere within the tool, and the heat is not readily dissipated.

SUMMARY OF THE INVENTION

In this invention, means are provided for transferring heat from selected electrical components to the housing of the instrument. The housing, which is drawn through the borehole liquid, transfers the heat to the liquid in the borehole. The components are mounted on a heat sink of rigid heat conductive metal. The heat sink has two ends and an outer surface of which at least a portion is arcuate and of substantially the same radius of curvature as the housing. Springs located at each end of the heat sink urge the outer surface into contact with the housing.

In one embodiment, the components are mounted to an inner surface of the heat sink which is located opposite the outer surface. In another embodiment, the components are located in cavities formed in the inner surface. In still another embodiment, the components are located on a supporting surface which is defined by webs, and which faces outwardly. The outer surfaces of the webs are arcuate and contact the housing.

BRIEF DESCRIPTION OF THE DRAWINGS

FIG. 1 is a cross-sectional, simplified view, of a portion of a well logging instrument, having a heat sink constructed in accordance with this invention.

FIG. 2 is a cross-sectional view of FIG. 1, but showing in addition the housing which is not shown in FIG. 1.

DESCRIPTION OF THE PREFERRED EMBODIMENT

Figure 3:
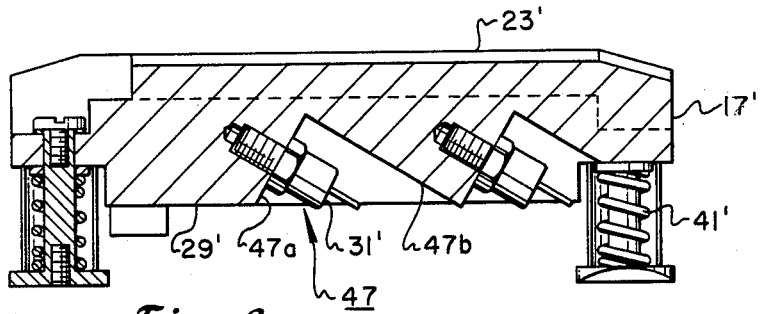
FIG. 3 is a cross-sectional view of an alternate embodiment for a heat sink.

Referring to FIG. 1, a portion of a wireline instrument 11 is shown. The instrument 11 will have a tubular housing 13, which is shown in FIG. 2. Housing 13 is sealed to prevent the entry of well fluids, and will contain a frame 15. Frame 15 is preferably a semi-cylindrical tubular member, as shown in FIG. 2. Frame 15 may be connected to other sections of frame, all of which slide telescopingly into the housing 13.

A heat sink 17 is mounted to the frame 15. Normally, there will be a number of heat sinks 17 of this or other type, all located within the instrument 11. Heat sink 17 is a rigid metal block of heat conducting material such as aluminum. Heat sink 17 has two ends 19 and 21, each of which is flat and located in a plane perpendicular to the axis of the frame 15. Each end 19 and 21 is located adjacent bulkheads 22 and 24 mounted to the frame 15.

Heat sink 17 has an outer surface 23 that is arcuate, as shown in FIG. 2. The radius of curvature of outer surface 23 is substantially the same as the radius of curvature of the inner diameter of housing 13. Preferably the inner diameter of housing 13 is 1.447 inch and the radius of outer surface 23 is 0.72 inch. The curved portion of the outer surface 23 extends approximately 120 degrees. Flate sides 25 are located on each edge of the outer surface 23 so as to provide clearance of the heat sink 17 with the sides of the frame 15. Sides 25 are parallel with each other and extend slightly into the frame 15.

The outer surface 23 also has beveled surfaces 27 located at each end 19 and 21. Each beveled surface 27 is conical, tapering from a reduced diameter at the extreme end to a larger diameter at the point where the beveled surface 27 joins the cylindrical portion of the outer surface 23. At the extreme ends, the beveled surface 27 has a radius that is no greater than the adjacent bulkheads 22 and 24 when heat sink 17 is in the extended position shown in FIG. 2. The tapered beveled surfaces 27 facilitate the insertion of the frame 15 into the housing 13.

Heat sink 17 has an inner surface 29 that is located on the opposite side from the outer surface 23. Inner surface 29 is flat and located in a plane that is perpendicular to the planes containing the sides 25. In the embodiment of FIGS. 1 and 2, inncer surface 29 is spaced approximately on the axis of the housing 13 when the heat sink 17 is in the compressed position, as shown in FIG. 2. This leaves a clearance or void space 30 between the inner surface 29 and the frame 15. As shown in FIG. 1, the electrical components 31 are mounted to the inner surface 29 by mounting means comprising screws 32.

Heat sink 17 is mounted to the frame 15 by means which includes a post 33 located at each end 19 and 21. Post 33 is a rigid metal post secured to frame 15 by a screw 35. Post 33 extends through a hole in heat sink 17, the hole having a smaller bore section 37a and a larger bore section 37b. Post 33 is of smaller diameter than either of the hole sections 37a or 37b. A screw 39 will screw into the end of the post 33 that is located in the hole section 37b. Screw 39 is larger in diameter than the hole section 37a, and smaller in diameter than the hole section 37b. In this manner, screw 39 retains the heat sink 17 with the frame 15.

A coil spring 41 is compressed between an annular shoulder 42 formed on post 33, and a washer 44 which bears against the heat sink inner surface 29. Spring 41 serves as spring means for urging the heat sink 17 away from the frame 15 and into contact with the inner diameter of housing 13. A rubber sleeve 43 surrounds the spring 41 to protect wires from being trapped within the coils of the spring 41. Wire bundles 45 for the components 31 extend through the space 30 and on opposite sides of the sleeve 43. For simplicity, the wires 45 are not shown connected to the components 31 in FIG. 1.

Figure 4:
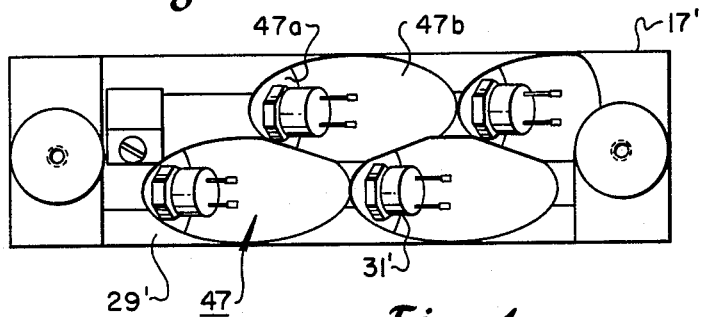
FIG. 4 is a bottom view of the heat sink of FIG. 3.

In the operation of the embodiment of FIGS. 1 and 2, when the frame 15 is removed from housing 13, the springs 41 will force the heat sink 17 outwardly to the extended position, so that its outer surface 23 protrudes beyond the bulkheads 22 and 24. In the extended position, the distance from the outer surface 23 to the opposite side of the frame 15 will be greater than the inner diameter of the housing 13. When the inserting the frame 15 into the housing 13, the housing 13 will contact the beveled surface 27 and cause the spring 41 to compress. The heat sink 17 will retract, fitting tightly in the housing 13. Outer surface 23 will be in tight contact with the housing 13. A significant portion of the heat generated by the components 31 will transfer through the heat sink 17 to the housing 13. The housing 13 will dissipate heat to the liquid if submerged or to the ambient atmosphere. In FIGS. 3 and 4, another version of a heat sink is shown. Prime symbols will be used to differentiate this version from the other version. Components that are essentially the same as in the other embodiments will not be described. Like the first version, heat sink 17 has an outer surface 23' that is arcuate and of the same radius as the housing for contact with the inner wall of the housing 13. Coil srings 41' urge the heat sink 17' outwardly into contact with the housing 13 (FIG. 2). In this embodiment, however, the electrical components 31' are located within cavities 47 formed in the inner surface 29'. For clearance purposes, the cavities 47 are formed at an angle that is inclined with respect to the axis of the heat sink 17'. Each cavity 47 has a flat bottom 47a that is a portion of a circle, and a truncated cylindrical sidewall 47b.

Figure 5:
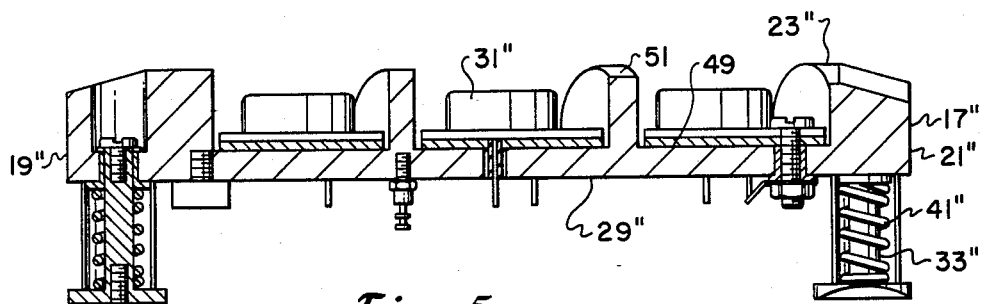
FIG. 5 is a cross sectional view of still another embodiment for a heat sink.

Another version of a heat sink is shown in FIG. 5. In this version, double prime symbols will be used to differentiate from the other embodiments. The heat sink 17" has an outer surface 23" which is urged against the housing 13 (FIG. 2) by coil springs 41". Unlike the other embodiments, however, the components 31" are mounted in slots or sections formed on a supporting surface 49. Supporting surface 49 is a flat surface located in a plane parallel with the inner surface 29". Supporting surface 49 is perpendicular to the posts 33".

Figure 6:
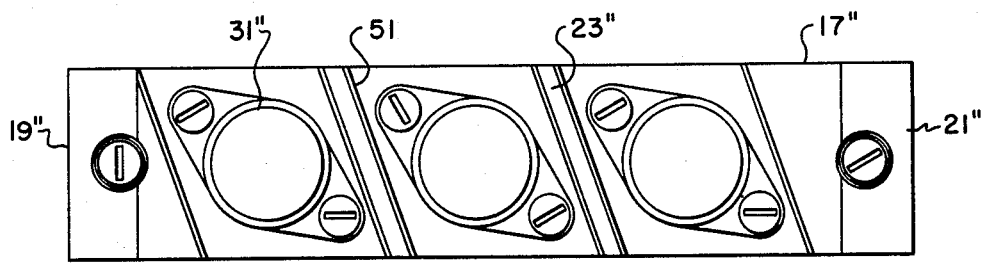
FIG. 6 is a top view of the heat sink of FIG. 5.

The supporting surface 49 is divided into three sections by two webs 51. Each web 51 is a thin vertical member extending outwardly perpendicular to the supporting surface 49. Each web 51 has an arcuate outer surface 23" that contacts the housing 13 (FIG. 2) in the same manner as described. Heat is transmitted not only through the heat sink sections 17" near the ends, but also through the webs 51. As shown in FIG. 6, the webs 51 are straight, but incline with respect to the ends 19" and 21". Each web 51 is formed at an acute angle with respect to a line formed perpendicular to the axis of heat sink 17". The supporting surface 49 and the webs 51 provide cavities in the outer surface 23" for the mounting of components 31".

The invention has significant advantages. The heat sinks provide significant metal contact between the power generating components and the housing. This provides better transfer of heat than through the air, as previously. The heat sinks are easily detached from the frame for access to the components. The beveled surfaces facilitate the insertion of the cartridge into the housing.

While the invention has been shown in only three of its forms, it should be apparent to those skilled in the art that it is not so limited but is susceptible to various changes without departing from the scope of the invention.

I claim:

1. In an instrument of the type having a tubular housing and a frame containing electrical components telescopingly carried in the housing, means for transferring heat from selected components to the housing, comprising in combination:

a heat sink of rigid heat conductive metal, having an outer surface of which a portion is arcuate and of substantially the same radius of curvature as the housing;

mounting means for mounting at least one of the components on the heat sink; and spring means located between the heat sink and frame for urging the heat sink outer surface into contact with the housing.

2. The instrument according to claim 1 wherein the outer surface has a beveled surface on at least one end which tapers from a reduced radius at the end to a larger radius at the portion that contacts the housing, to facilitate insertion of the frame into the housing.

3. The instrument according to claim 1 wherein the heat sink has an inner surface located on a side opposite the outer surface and positioned to provide a clearance between the frame and the inner surface, at least one of the components being mounted to the inner surface.

4. The instrument according to claim 1 wherein the heat sink has an inner surface located on a side opposite the outer surface which is positioned to provide a clearance between the frame and the inner surface, the inner surface having at least one cavity into which one of the components is mounted.

5. The instrument according to claim 1 wherein the heat sink has at least one cavity formed in the outer surface into which one of the components is mounted.

6. In an instrument of the type having a tubular housing and a frame containing electrical components telescopingly carried in the housing, means for transferring heat from selected components to the housing, comprising:

a heat sink of rigid, heat conductive metal having two ends, an outer surface of which a portion is arcuate and substantially the same radius of curvature as the housing, and an inner surface located on a side opposite the outer surface and positioned to provide a clearance between the frame and the inner surface;

mounting means for mounting at least one of the components on the inner surface; and spring means mounted between the frame and the heat sink on each end opposite the outer surface for urging the heat sink outer surface into contact with the housing.

7. In an instrument of the type having a tubular housing and a frame containing electrical components telescopingly carried in the housing, means for transferring heat from selected components to the housing, comprising:

a heat sink of rigid, heat conductive metal, having two ends, an outer surface of which a portion is arcuate and of substantially the same radius of curvature as the housing, and an inner surface located on a side opposite the outer surface and positioned to provide a clearance between the frame and the inner surface, the inner surface having a plurality of cavities located therein;

mounting means for mounting at least one of the components in each of the cavities; and spring means mounted between the frame and the heat sink on each end opposite the outer surface for urging the heat sink outer surface into contact with the housing.

8. In an instrument of the type having a tubular housing and a frame containing electrical components telescopingly carried in the housing, means for transferring heat from selected components to the housing, comprising:

a heat sink of rigid, heat conductive metal, the heat sink having a component supporting surface which is divided into sections by at least one web protruding outwardly, the web having an outer surface that is substantially the same radius as the housing;

means for mounting a component in each of the sections; and spring means mounted between the frame and the heat sink on each end opposite the supporting surface, for urging the web outer surface into contact with the housing.

9. The instrument according to claim 8 wherein the heat sink has an axis that is parallel with the axis of the instrument, and wherein the web is formed at an acute angle with respect to a line that is perpendicular to the axis of the heat sink.

* * * * *